(12) United States Patent
Haumesser et al.

(10) Patent No.: US 8,518,816 B2
(45) Date of Patent: Aug. 27, 2013

(54) METHOD FOR MAKING ELECTRICAL INTERCONNECTIONS WITH CARBON NANOTUBES

(75) Inventors: Paul-Henri Haumesser, Saint Cassien (FR); Jean-Marie Basset, Caluire-et-Cuire (FR); Paul Campbell, Middlesbrough (GB); Simon Deleonibus, Claix (FR); Thibaut Gutel, Veurey-Voroize (FR); Gilles Marchand, Pierre-Chatel (FR); Catherine Santini, Collonges au Mont d'Or (FR)

(73) Assignees: Commissariat a l'Energie Atomique et aux Energies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/260,460

(22) PCT Filed: Mar. 24, 2010

(86) PCT No.: PCT/EP2010/053839
§ 371 (c)(1),
(2), (4) Date: Jan. 3, 2012

(87) PCT Pub. No.: WO2010/108957
PCT Pub. Date: Sep. 30, 2010

(65) Prior Publication Data
US 2012/0094479 A1    Apr. 19, 2012

(30) Foreign Application Priority Data
Mar. 27, 2009   (FR) .................................. 09 01464

(51) Int. Cl.
*H01L 21/4763* (2006.01)
(52) U.S. Cl.
USPC ............ 438/618; 257/E21.049; 257/E21.582; 257/E21.589; 438/597; 977/700; 977/742; 977/773; 977/775; 977/843; 977/902

(58) Field of Classification Search
USPC .................. 257/E21.049, E21.582, E21.589; 438/597, 618; 977/700, 742, 773, 775, 843, 977/902
See application file for complete search history.

(56) References Cited

U.S. PATENT DOCUMENTS

| | | | |
|---|---|---|---|
| 5,768,192 | A | 6/1998 | Eitan |
| 6,346,450 | B1 | 2/2002 | Deleonibus et al. |

(Continued)

FOREIGN PATENT DOCUMENTS

EP   1 946 833 A1   7/2008

OTHER PUBLICATIONS

French Preliminary Search Report issued Oct. 14, 2009, in Patent Application No. 0901464.

(Continued)

*Primary Examiner* — Asok K Sarkar
(74) *Attorney, Agent, or Firm* — Oblon, Spivak, McClelland, Maier & Neustadt, L.L.P.

(57) ABSTRACT

A method for making electrical interconnections of carbon nanotubes, including a) depositing an ionic liquid including nanoparticles of at least one suspended electrically conducting material, covering at least one surface of an element configured to be used as a support for carbon nanotubes, b) forming a deposit of the nanoparticles at least against the surface of the element, c) removing the remaining ionic liquid, d) growing carbon nanotubes from the deposited nanoparticles, and further including between the c) removing the remaining ionic liquid and the d) growing carbon nanotubes, passivating the deposited nanoparticles not found against the surface of the element.

10 Claims, 3 Drawing Sheets

(56) References Cited

U.S. PATENT DOCUMENTS

Figure 1:
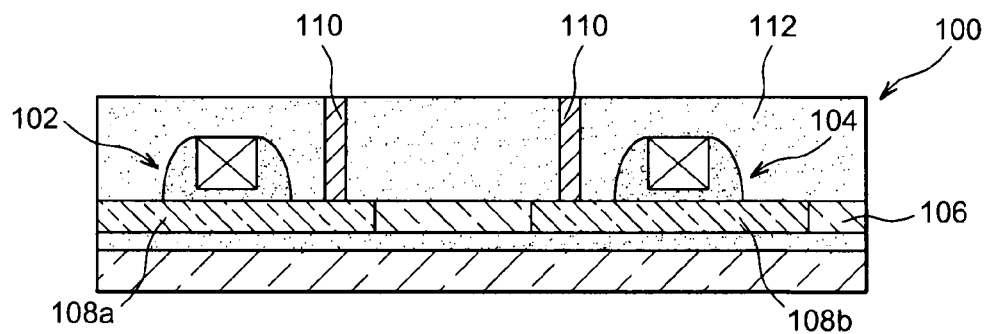

| | | |
|---|---|---|
| 6,955,963 B2 | 10/2005 | Deleonibus et al. |
| 7,161,206 B2 | 1/2007 | Oh et al. |
| 2006/0086958 A1 | 4/2006 | Eimori |
| 2006/0284537 A1* | 12/2006 | Tolt .............................. 313/306 |
| 2007/0063263 A1 | 3/2007 | Oh et al. |
| 2008/0299307 A1 | 12/2008 | Ward et al. |
| 2009/0131245 A1 | 5/2009 | Esconjauregui et al. |

OTHER PUBLICATIONS

Zhonghao Li, et al., "Ionic liquids for synthesis of inorganic nanomaterials", Current Opinion in Solid State and Materials Science, vol. 12, No. 1, XP025973047, Feb. 1, 2009, pp. 1-8.

Thomas Welton, "Room-Temperature Ionic Liquids, Solvents for synthesis and Catalysis", Chemical Reviews, vol. 99, Jul. 7, 1999, pp. 2071-2083.

V. Carreau. et. al., "Evolution of Cu microstructure and resistivity during thermal treatment of damascene line: Influence of line width and temperature", Microelectronic Engineering, vol. 84, 2007, pp. 2723-2728.

J.C. Coiffic, et al., "Conduction regime in innovative carbon nanotube via interconnect architectures", Applied Physics Letters, vol. 91, 2007, pp. 252107-1-252107-3.

M. Dubosc, et al., "Impact of the Cu-based substrates and catalyst deposition techniques on carbon nanotube growth at low temperature by PECVD", Microelectronic Engineering, vol. 84, 2007, pp. 2501-2505.

Thibaut Gutel, et al., "Influence of the self-organization of ionic liquids on the size of ruthenium nanoparticles: effect of the temperature and stirring", Journal of Materials Chemistry, vol. 17, 2007, pp. 3290-3292.

A. Kukovecz, et al., "Catalytic synthesis of carbon nanotubes over Co, Fe and Ni containing conventional and sol-gel silica-aluminas", Physical Chemistry Chemical Physics, vol. 2, 2000, pp. 3071-3076.

Hidekazu Nishino, et al., "Water-Assisted Highly Efficient Synthesis of Single-Walled Carbon Nanotubes Forests from Colloidal Nanoparticle Catalysts", Journal of Physical Chemistry, vol. 111, 2007, pp. 17961-17965.

* cited by examiner

METHOD FOR MAKING ELECTRICAL INTERCONNECTIONS WITH CARBON NANOTUBES

TECHNICAL FIELD

The invention relates to the making of electrical interconnections in the field of micro-electronics and of nano-electronics. The invention particularly applies to the making of electrical interconnections (conduction lines and/or interconnection holes, or vias) for micro-electronic and/or nano-electronic components.

STATE OF THE PRIOR ART

In the field of microelectronics, the structures of interconnections of microelectronic components include two types of elements:

conduction lines, which form the essential part of the circuits. These lines are generally made in the form of several levels or stages, for example ten in number, superposed above each other and electrically connecting different elements with each other, for example several electrical contacts of different components, the vias, or interconnection holes, provide electrical connection of two levels of conduction lines with each other.

The interconnection structures are generally made from copper because of its low electrical resistance and of its good resistance to electromigration, i.e. to movements of material under the influence of flows of electrons.

However, miniaturization of micro-electronic devices causes a reduction in the size of the structures of interconnections. At constant current, the reduction of the sections of the interconnections implies an increase in the current densities in these interconnections. Thus, the generations of devices for which the line widths are less than about 50 nm, for example electronic components made in 22 nm technology, will require current densities of more than $2.10^6$ A/cm$^2$, increasing the electromigration phenomenon beyond bearable limits for copper-based interconnections. Moreover, the resistivity of copper increases as the section of the interconnections decreases, making the use of copper incompatible for structures with dimensions of less than about 50 nm.

In order to overcome these problems, it is contemplated to replace the structures of copper-based interconnections with interconnection structures based on carbon nanotubes, both for the vias (contact or interconnection holes) and conduction lines. Carbon nanotubes are in this case made by PECVD (Plasma Enhanced Chemical Vapor Deposition) since this is the only technique for synthesizing nanotubes, known to this day, for which the application temperature is sufficiently low in order to be compatible with the architectures used in microelectronics.

However, this technique requires that a preliminary deposit of a catalyst be achieved in the form of nanoparticles based on an electrically conducting material, with which it is possible to then achieve growth of the carbon nanotubes from this catalyst. The density and the size of the carbon nanotubes obtained depend on the surface density and on the size of the metal nanoparticles forming the catalyst. For making such structures of interconnections, the density of the carbon nanotubes should be sufficient in order to form a sufficiently conducting network of carbon nanotubes. This implies having a minimum density of catalytic sites, i.e. of nanoparticles, of the order of $10^{12}$ to $10^{13}$ nanoparticles/cm$^2$. Further, there also exist constraints regarding the diameter of the carbon nanotubes, the latter should not exceed about 10 nm.

This deposition of nanoparticles may for example be achieved in a thin layer. In this case, a thick film of a few nanometers and based on an electrically conducting material is deposited on the surface intended to receive the carbon nanotubes. By subjecting this thin layer to heating, the latter fractures and coalesces into nanoparticles which may then be used as catalysts for growing carbon nanotubes. This deposit of catalyst sites may also be obtained by using colloidal metal nanoparticles dispersed in an organic solvent and stabilized with a surfactant, and then applied on the desired surface by spin coating.

However, regardless of the technique used for forming the deposit on nanoparticles, it is difficult to obtain a satisfactory density of nanoparticles, with which it is then possible to grow carbon nanotubes from these nanoparticles in order to form interconnections. Further, the size of the nanoparticles as well as their dispersion and their distribution are difficult to control, which poses significant problems for making interconnections with carbon nanotubes from these deposits of nanoparticles since these parameters directly have an influence on the size, the density and the dispersion of the obtained carbon nanotubes.

DISCUSSION OF THE INVENTION

An object of the present invention is to propose a method for making electrical interconnections based on carbon nanotubes not having the drawbacks of the prior art, i.e. allowing improvement in the control of the size, density and dispersion of the carbon nanotubes made.

For this, the present invention proposes a method for making electrical interconnections of carbon nanotubes, including at least the steps of:

a) depositing an ionic liquid comprising nanoparticles of at least one suspended electrically conducting material covering at least one surface of an element intended to be used as a support for carbon nanotubes, b) forming a deposit of said nanoparticles at least against said surface of the element, c) removing the remaining ionic liquid, d) growing carbon nanotubes from said deposited nanoparticles.

By ionic liquid is meant an organic salt or a mixture of organic salts for which the melting point is less than or equal to about 100° C., forming associations of organic cations and organic or inorganic anions.

The use of an ionic liquid in the method according to the invention for making and depositing nanoparticles used as catalyst has several advantages.

First of all, an ionic liquid has low volatility and a very low vapor pressure unlike volatile organic solvents or aqueous solvents. The ionic liquids may therefore be used at much higher temperatures and at much lower pressures than volatile organic solvents. Further, ionic liquids also have great thermal stability up to temperatures for example above about 400° C., and great chemical stability which is an advantage from the point of view of safety of application of industrial processes as compared with that of organic solvents.

Ionic liquids also allow easy recycling and purification of the reaction products. They are also non-flammable and have strong power for solubilizing both salts and neutral organic molecules, polymers, various materials such as transition metal complexes (for example catalysts) or further gases.

Ionic liquids may be used in electrochemistry because of their ionic conductivity and of their wide electrochemical window, and their physical properties may be modulated according to the type of anion and cation which make it up.

Their wide electrochemical window also allows synthesis of a large range of metals, in particular those which are not accessible for example in electrochemistry in an aqueous medium, such as iron which may be used for growing carbon nanotubes.

Ionic liquids also have low surface pressure, allowing good wetting of the surfaces to be treated. This property ensures good penetration of the liquid inside the patterns (line flanks or bottom of vias), unlike the methods of the prior art of the "dewetting" type in which the initial thin films are deposited by PVD, a non-compliant deposition technique.

Further, with the invention, it is possible to have very good control on the rated size of the nanoparticles, as well as homogeneous distribution of the sizes of these nanoparticles, in the ionic liquid, thereby allowing easy modulation of the size of the carbon nanotubes made from the deposited nanoparticles and ensuring increased structural homogeneity of the nanotubes, which guarantees better conduction performances of the interconnections as compared with interconnections made according to the methods of the prior art.

The method according to the invention gives the possibility of obtaining a deposit of mono-dispersed nanoparticles, i.e. all including a substantially similar size to within one or two atoms (a nanoparticle may include for example about 100 atoms). The deposited nanoparticles do not touch each other.

The use of an ionic liquid further provides wetting properties which are favorable to the penetration of the latter into sub-micron etched structures, as well as very good rheological properties promoting control of the spreading of the ionic liquid, for example, during deposition of the latter by spin coating or by spraying.

The ionic liquid may be deposited during step a) by spin coating, spraying or by immersion.

The step b) for forming the deposit of said nanoparticles may include at least one step for incubating said element and the ionic liquid for a period comprised between about one minute and one hour, or longer than or equal to about one minute.

A non-zero electrical potential difference may be applied between said element and the ionic liquid during at least one portion of the step b) for forming the deposit of nanoparticles. In this case, the ionic liquid is preferably deposited by immersion.

The step c) for removing the ionic liquid may include a step for rinsing with a solvent and a drying step, or a step for degrading the ionic liquid by a heat treatment at a temperature for example comprised between about 200° C. and 450° C., or between about 200° C. and 400° C. By carrying out a heat treatment in order to remove the excess of ionic liquid, it is notably possible to maximize the density of the deposited nanoparticles. In the case of removal of the remaining ionic liquid by degradation with a heat treatment, this degradation may be assisted by an energy source, for example a source of ultraviolet rays, illuminating the ionic liquid during the thermal degradation.

Preferably, the ionic liquid may include at least one cation of the imidazolium type bearing alkyl substituents. Such an ionic liquid notably allows improvement in the repeatability relating to the control of the size of the nanoparticles of the electrically conducting layer, the size of an alkyl substituent corresponding to a given nanoparticle size.

The ionic liquid may be selected from $BMIMNTf_2$, $HMIMNTf_2$ or $OMIMNTf_2$, and/or the particles suspended in the ionic liquid may be based on ruthenium or any other electrically conducting material suitable for making a catalyst for growing carbon nanotubes.

The method may further include between step c) for removing the remaining ionic liquid and the step d) for growing carbon nanotubes, a step for passivating the deposited nanoparticles not found against said surface of the element.

The step d) for growing carbon nanotubes from said nanoparticles may be achieved by PECVD.

The ionic liquid deposited in step a) may cover at least two surfaces facing each other, the deposit of nanoparticles may be formed during step b) at least against said two surfaces, and in which the carbon nanotubes made may join nanoparticles positioned against said two surfaces.

Said element may be an electrically conducting region of a micro-electronic device.

The interconnections made may form conduction lines and/or vias electrically connected to at least one micro-electronic device.

SHORT DESCRIPTION OF THE DRAWINGS

The present invention will be better understood upon reading the description of exemplary embodiments given purely as an indication and by no means as a limitation, with reference to the appended drawings wherein:

FIGS. 1 to 6 represent the steps of a method for making electrical interconnections of carbon nanotubes, object of the present invention, according to a particular embodiment.

Identical, similar or equivalent portions of the different figures described hereafter bear the same numerical references so as to facilitate switching from one figure to the other.

The different portions illustrated in the figures are not necessarily illustrated according to a uniform scale, in order to make the figures more legible.

The different possibilities (alternatives and embodiments) should be understood as not being exclusive from each other and may be combined together.

DETAILED DISCUSSION OF PARTICULAR EMBODIMENTS

Reference is made to FIGS. 1 to 6 which represent steps of a method for making electrical interconnections of carbon nanotubes according to a particular embodiment.

As illustrated in FIG. 1, the interconnections are made in a micro-electronic device 100 including two MOS transistors 102 and 104. Both of these MOS transistors 102, 104 each include an active area 108a and 108b, in which are formed the source, drain and channel regions in an active layer 106, for example based on a semiconductor, such as silicon, of an SOI (Semiconductor On Insulator) substrate. The drain regions of the active area 108a and source regions of the active area 108b are electrically connected to vias 110 formed through a dielectric layer 112, for example based on a semiconductor oxide or semiconductor nitride, covering the whole of the elements of the device 100.

Figure 2:
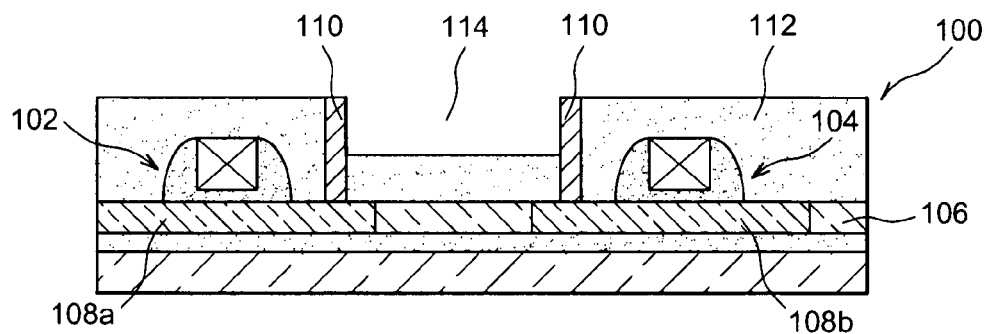

As illustrated in FIG. 2, a recess 114 is made in the dielectric layer 112 between both vias 110, forming a location of the interconnections which will be made between the vias 110 and will electrically connect them to each other.

Figure 3:
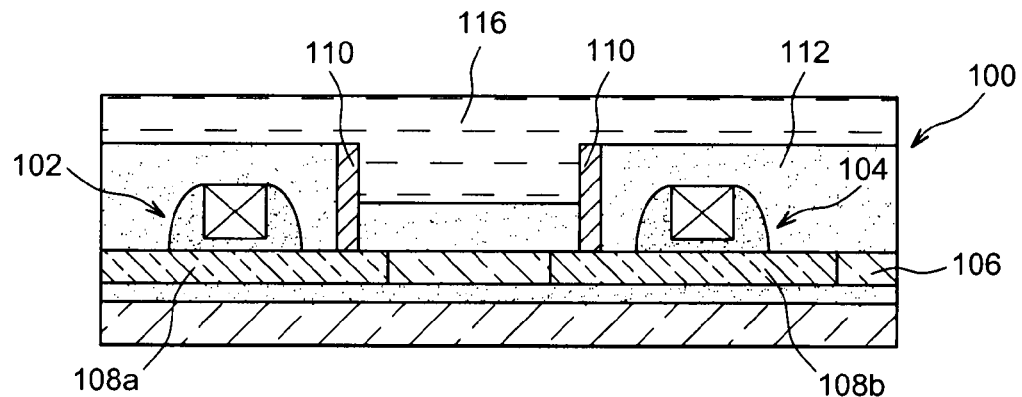

An ionic liquid 116 in which metal nanoparticles have been synthesized, will then be spread over the whole of the structure made beforehand, for example by applying spin coating, spraying or immersion. The ionic liquid 116 then covers the dielectric layer 112, the walls of the vias 110 and fills the recess 114 (FIG. 3).

The nanoparticles are aggregates of a few tens of atoms or a few hundred atoms of transition metals (ruthenium, rhodium, palladium, etc, . . . ) having variable geometries and for which the dimensions are of the order of a few nanometers, for example having a diameter comprised between about 1 nm and 10 nm. The presence of a significant number of atoms at the surface leads to magnetic, electronic and catalytic properties at the boundary between the molecular state and the bulk state.

Synthesis of nanoparticles in an ionic liquid may be achieved by putting an organic metal complex in solution in an matrix ionic liquid with stirring at room temperature and then by cooling the reaction medium to a temperature close to 0° C. The medium is pressurized under hydrogen for a period comprised between a few hours and a few days (depending on the complexes) until a suspension of metal nanoparticles is obtained.

By matrix ionic liquid is meant an ionic liquid at room temperature capable of solubilizing one or more chemical species such as mineral or organic salts, or organic or organometallic molecules. This ionic liquid may be used pure or mixed and consisting of one or more ionic liquids (for example an amine, an alcohol, a thiol or an ether) either functionalized or not. The ionic liquid may also be mixed with another hydrophobic solvent.

Three exemplary embodiments of synthesis of metal nanoparticles in ionic liquids are described below, the obtained ionic liquids, which include suspended metal nanoparticles may be used in the method for making interconnections described herein.

Example of Synthesis of Ruthenium Nanoparticles in an Ionic Liquid of the BMIMNTf$_2$ Type:

In a glove box, i.e. a sealed box under a controlled atmosphere (for example under an argon atmosphere) in which handling operations are carried out with gloves, 10 mL of 1-butyl-3-methyl imidazolium bis(trifluoromethanesulfonyl) imide (BMIMNTf$_2$) are introduced into a glass autoclave. Ru(COD)(COT)(135 mg, 0.43 mmol, C=0.043 mol/L) is then totally dissolved therein at room temperature and with strong stirring for one hour. When a homogeneous solution is obtained, the reaction medium is cooled down to a temperature equal to about 0° C. and stirring is stopped. The temperature of the medium is stabilized to about 0° C. The autoclave is then swept with a stream of hydrogen and then pressurized under hydrogen at 4 bars for 72 hours. The medium is then evacuated in vacuo in order to remove the formed cyclooctane (COA). A black colloidal suspension of ruthenium nanoparticles, each of which has a diameter equal to about 1.1 nm+/−0.2 nm, homogeneously dispersed without any agglomeration and for which the size distribution is very narrow, is thereby obtained.

The suspension of ruthenium nanoparticles obtained in the ionic liquid is stable for several months when the latter is placed under an argon atmosphere at room temperature. Further, even by achieving centrifugation of the obtained solution or by achieving precipitation with organic solvents (alkanes, dichloromethane, acetonitrile), no decantation of the ruthenium nanoparticles is observed in the ionic liquid.

Example of Synthesis of Ruthenium Nanoparticles in an Ionic Liquid of the HMIMNTf$_2$ Type:

In a glove box, 10 mL of 1-hexyl-3-methylimidazolium bis(trifluoromethanesulfonyl)imide (HMIMNTf$_2$) are introduced into a glass autoclave. Ru(COD)(COT) (135 mg, 0.43 mmol, C=0.043 mol/L) is then totally dissolved therein at room temperature and under strong stirring for one hour. When a homogeneous solution is obtained, the reaction medium is cooled down to a temperature equal to about 0° C. and stirring is stopped. The temperature of the medium is stabilized to about 0° C. The autoclave is then swept with a stream of hydrogen and then pressurized under hydrogen at 4 bars for 72 hours. The medium is then evacuated in vacuo in order to remove the formed cyclooctane (COA). A black colloidal suspension of ruthenium nanoparticles, each of which has a diameter equal to about 1.9 nm+/−0.2 nm, homogeneously dispersed without any agglomeration and for which the size distribution is very narrow, is thereby obtained.

There again, the suspension of ruthenium particles obtained in the ionic liquid is very stable for several months when the latter is placed under an argon atmosphere, at room temperature. Further, even by achieving centrifugation of the obtained solution or achieving precipitation with organic solvents (alkanes, dichloromethane, acetonitrile), no decantation of the ruthenium nanoparticles is observed in the ionic liquid.

Example of Synthesis of Ruthenium Nanoparticles in an Ionic Liquid of the OMIMNTf$_2$ Type:

In a glove box, 10 mL of 1-octyl-3-methylimidazolium bis(trifluoromethanesulfonyl)imide (OMIMNTf$_2$) are introduced into a glass autoclave. Ru(COD)(COT)(135 mg, 0.43 mmol, C=0.043 mol/L) is then dissolved totally therein, at room temperature and under strong stirring for one hour. When a homogeneous solution is obtained, the reaction medium is cooled down to a temperature equal to about 0° C. and stirring is stopped. The temperature of the medium is stabilized from about 0° C. The autoclave is then swept with a stream of hydrogen and then pressurized under hydrogen at 4 bars for 72 hours. The medium is then evacuated in vacuo in order to remove the formed cyclooctane (COA). A black colloidal suspension of ruthenium nanoparticles, each of which has a size equal to about 1.9 nm+/−0.2 nm, homogeneously dispersed without any agglomeration and for which the size distribution is very narrow, is thereby obtained.

There again, the suspension of ruthenium nanoparticles obtained in the ionic liquid is very stable for several months when the latter is placed under an argon atmosphere at room temperature. Further, even by achieving centrifugation of the obtained solution or achieving precipitation with organic solvents (alkanes, dichloromethane, acetonitrile), no decantation of the ruthenium nanoparticles is observed in the ionic liquid.

Ionic liquids, as well as their manufacturing methods, described in the document <<Room Temperature Ionic Liquids, Solvents for Synthesis and Catalysis << of Thomas Welton, Chem. Rev, 1999, Vol. 99, No. 8, pages 2071-2084, may also be used for applying the method for making interconnections as described here.

After having spread over the whole of the structure, the ionic liquid 116 in which metal nanoparticles have been synthesized, the whole is left to incubate for example at room temperature and for a period comprised between about 1 minute and 1 hour, in order to form a deposit of nanoparticles 118 initially found in the ionic liquid against the walls of the recess 114 and notably on the side walls of the recess 114 formed by the vias 110 as well as on the dielectric 112. These nanoparticles 118 for example each consist of about 100 atoms. The nanoparticles 118 for example each have a diameter substantially equal to about 2 nm and are spaced apart from each other by a distance substantially equivalent to their diameter, i.e. for example 2 nm. The density of the nanoparticles 118 obtained is for example equal to about $5.10^{13}$ cm$^{-2}$.

The incubation period is notably selected according to the desired density of nanoparticles: the longer this incubation period, the more significant will be the density of the obtained deposit of nanoparticles 118.

In one alternative, it is possible to functionalize beforehand the surface on which the nanoparticles 118 are deposited, notably at the location of the interconnections. In the present case, the surfaces to be functionalized would be the side walls of the recess 114 formed by the vias 110. Such a functionalization notably gives the possibility of promoting adhesion of the nanoparticles on these surfaces. Such a functionalization gives the possibility of providing a terminal group on the surface on which the nanoparticles are deposited, which may interact with the metal particles, which may modify the kinetics of the adsorption reaction of the particles, their surface density and their stability on the surface during a rinsing step. This functionalization may be achieved for example by silanization or electrografting of diazonium salts. The terminal groups may for example be selected from thiol, carboxylate, carboxylic acid, amine, ammonium, thioester, thiourea groups, etc.

Such a functionalization may also be applied for making the dielectric areas completely inert surrounding the electrically conducting areas intended to receive the deposit of nanoparticles, for example by silanization, the dielectric areas may be based on silicon oxide.

Figure 4:
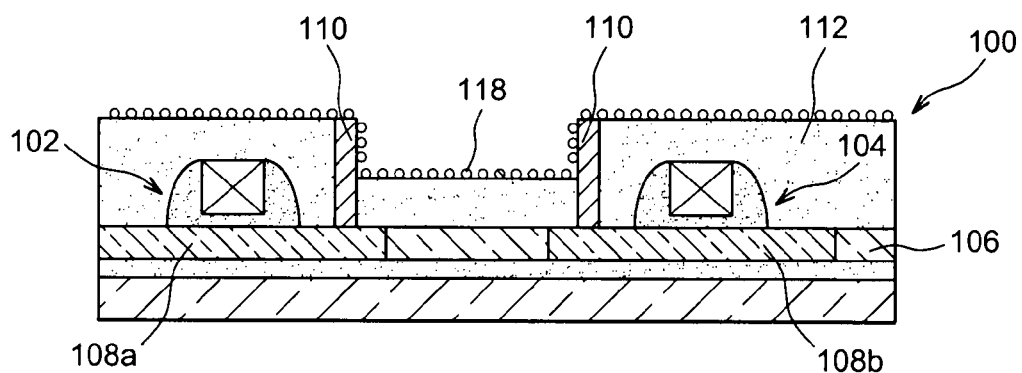

As illustrated in FIG. 4, the excess of ionic liquid 115 is then removed, for example by rinsing with 95% ethanol by drying with argon, in order to only retain the metal layer 118 of nanoparticles and remove the remainders of solvents. It is also possible to remove the excess of ionic liquid by achieving degradation with a heat treatment at a temperature for example comprised between about 200° C. and 450° C. This degradation of ionic liquid residues may also be achieved during the first instants of the PECVD deposition of carbon nanotubes, performed subsequently. It is possible that the organic residues themselves form a source of carbon which may contribute to initiating the growth of carbon nanotubes.

Figure 5:
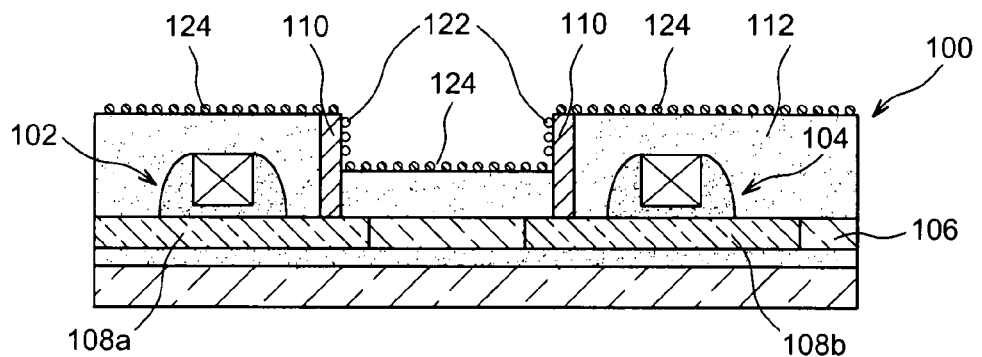

Localized passivation of the nanoparticles 118 which are not intended to be used as catalysts for growing carbon nanotubes, is then achieved, i.e. here nanoparticles 118 found on the dielectric 112 and on the top of the vias 110, as well as on the bottom wall of the recess 114. These passivated nanoparticles are designated in FIG. 5 with reference 124. Only the nanoparticles 118 found against the side walls of the vias 110 are kept electrically conducting (FIG. 5, reference 122). This passivation of nanoparticles is for example achieved by localized masking or poisoning treatments, for example with directional deposits. For example, achieving a non-compliant deposit by spraying which would mask the horizontal surfaces without affecting the nanoparticles 122 found against the side walls of the vias 110 by a shadowing effect, may be contemplated.

Figure 6:
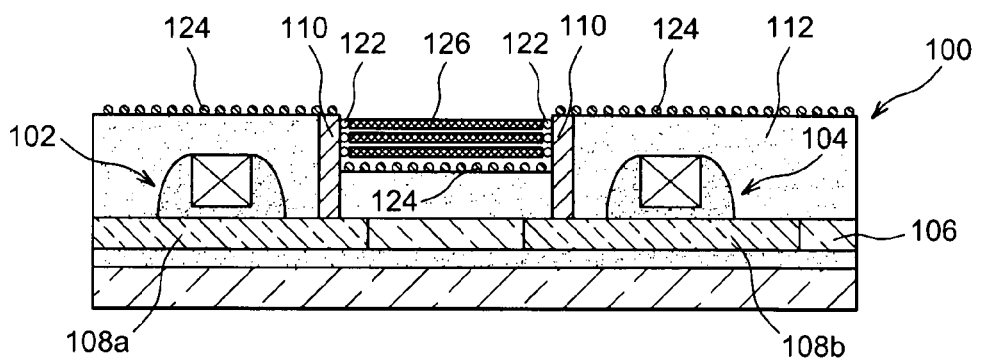

Finally, as illustrated in FIG. 6, growing carbon nanotubes 126 is carried out by using the electrically conducting nanoparticles 122 deposited beforehand against the vias 110, for example by PECVD. By extending between the nanoparticles 122, the nanotubes 126 form an electric interconnection between the vias 110, electrically connecting the drain of the transistor 102 to the source of the transistor 104.

Each nanoparticle 122 therefore forms a catalyst site for growing a carbon nanotube. The dimensions of the carbon nanotubes made depend on the size of the nanoparticles being used as catalyst. Thus, it is for example possible to make nanotubes with a simple wall by choosing to deposit nanoparticles for which the dimensions are comprised between about 1 nm and 3 nm or nanotubes with multiple walls, for example including between 2 and 10 walls positioned in each other, by choosing to deposit nanoparticles for which the dimensions are comprised between about 3 nm and 10 nm.

In an alternative of the method detailed above, it is possible, after spreading of the ionic liquid 116, to bias the vias 110 with regard to the ionic liquid 116, in order to achieve selective deposition of the nanoparticles on the vias 110 relatively to the other materials in contact with the ionic liquid 116. By applying a potential difference between the vias 110 and the ionic liquid 116, a more intense electric field is present at the vias 110 than at the level of the other materials in contact with the ionic liquid 116. This electric field difference gives the possibility of increasing the deposition rate of the nanoparticles on the walls of the vias 110 relatively to that at the bottom wall of the recess 114 formed by a portion of the silicon layer 106 as well as at the dielectric layer 112, and thereby promotes deposition of the nanoparticles contained in the ionic liquid 116 onto the walls of the vias 110. A quasi-selective deposition of the nanoparticles is thereby achieved on the vias 110, at areas where are found the portions 122 of the electrically conducting layer 118.

The method described above may also be applied for making vias between a conduction line, which may also be achieved from carbon nanotubes, and an electrical contact of the device 100, and/or between two interconnection levels, and/or further for making conduction lines of the different interconnection levels.

The invention claimed is:

1. A method for making electrical interconnections of carbon nanotubes, comprising:
   a) depositing an ionic liquid comprising suspended electrically neutral nanoparticles of at least one electrically conducting material, covering at least one surface of an element configured to be used as a support for carbon nanotubes;
   b) forming a deposit of the nanoparticles at least against the surface of the element, said forming including applying a non-zero electric field between the element and the ionic liquid;
   c) removing remaining ionic liquid,
   d) growing carbon nanotubes from the deposited nanoparticles;
   and further including between the c) removing the remaining ionic liquid and the d) growing carbon nanotubes, passivating the deposited nanoparticles not formed against the surface of the element.

2. The method according to claim 1, wherein the ionic liquid is deposited during a) by centrifugation, projection, or immersion.

3. The method according to claim 1, wherein the b) forming the deposit of the nanoparticles includes at least incubating the element and the ionic liquid for a period between about 1 minute and 1 hour.

4. The method according to claim 1, wherein the c) removing the ionic liquid includes rinsing with a solvent and a drying, or degrading the ionic liquid with a heat treatment at a temperature between about 200° C. and 400° C.

5. The method according to claim 1, wherein the ionic liquid includes at least one cation of the imidazolium type bearing alkyl substituents.

6. The method according to claim 1, wherein the ionic liquid is selected from $BMIMNTf_2$, $HMIMNTf_2$, or $OMIMNTf_2$, and/or suspended nanoparticles in the ionic liquid are based on ruthenium.

7. The method according to claim 1, wherein the d) growing carbon nanotubes from the nanoparticles is carried out by PECVD.

8. The method according to claim 1, wherein the ionic liquid deposited in a) covers at least two surfaces facing each other, the deposit of nanoparticles being formed, during b), at least against the two surfaces, and wherein the carbon nanotubes made join nanoparticles positioned against the two surfaces.

9. The method according to claim 1, wherein the element is an electrically conducting region of a micro-electronic device.

10. The method according to claim 1, wherein the interconnections made form conduction lines and/or vias electrically connected to at least one micro-electronic device.

\* \* \* \* \*